United States Patent
Mizoguchi et al.

(10) Patent No.: US 6,831,864 B2
(45) Date of Patent: Dec. 14, 2004

(54) METHOD OF ERASING DATA OF NONVOLATILE SEMICONDUCTOR MEMORY UNIT (75) Inventors: Shinichi Mizoguchi, Tokyo (JP); Tomoshi Futatsuya, Tokyo (JP); Takashi Hayasaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 16 days.

(21) Appl. No.: 10/601,551

(22) Filed: Jun. 24, 2003

(65) Prior Publication Data

US 2004/0125656 A1 Jul. 1, 2004

(30) Foreign Application Priority Data

Dec. 26, 2002 (JP) ........................................ 2002-376747

(51) Int. Cl.[7] ............................................... G11C 16/04
(52) U.S. Cl. ........................... 365/185.29; 365/185.19; 365/185.22
(58) Field of Search ........................ 365/185.22, 185.29, 365/185.3, 185.19, 185.11, 218

(56) References Cited

U.S. PATENT DOCUMENTS

| | | | | |
|---|---|---|---|---|
| 6,243,292 B1 | * | 6/2001 | Kobayashi et al. | .... 365/185.13 |
| 6,330,192 B1 | | 12/2001 | Ohba et al. | |
| 6,388,921 B1 | * | 5/2002 | Yamamoto et al. | .... 365/185.11 |
| 6,515,908 B2 | * | 2/2003 | Miyawaki et al. | ..... 365/185.22 |

FOREIGN PATENT DOCUMENTS

JP        2001-283595       10/2001

* cited by examiner

*Primary Examiner*—Son T. Dinh
*Assistant Examiner*—Hien Nguyen
(74) *Attorney, Agent, or Firm*—McDermott Will & Emery LLP (57) ABSTRACT A method of erasing data of a nonvolatile semiconductor memory unit includes the first step of collectively applying a preliminary write pulse to memory transistors, the second step of repeating, up to a first erased state, an operation of collective application of a first erase pulse to the memory transistors with change of intensity of the first erase pulse in second and subsequent application operations of the first erase pulse, the third step of repeating, up to a recovered state, an operation of collective application of a write pulse to the memory transistors with change of intensity of the write pulse in second and subsequent application operations of the write pulse, the fourth step of repeating, up to a second erased state, an operation of collective application of a second erase pulse to the memory transistors with change of intensity of the second erase pulse in second and subsequent application operations of the second erase pulse and the fifth step of repeating a selective recovery operation on the memory transistors until the memory transistors are not in an overerased state.

4 Claims, 7 Drawing Sheets

METHOD OF ERASING DATA OF NONVOLATILE SEMICONDUCTOR MEMORY UNIT

BACKGROUND OF THE INVENTION

1. Field of the Invention

The present invention generally relates to a nonvolatile semiconductor memory unit in which data can be written and erased electrically and more particularly, to a method of erasing data of a nonvolatile semiconductor memory (hereinafter, referred to as a "flash memory"), in which the data is erased in all memory cells collectively or in units of memory blocks each having a set of the memory cells.

2. Description of the Prior Art

The flash memory uses, as memory cells, transistors (hereinafter, referred to as "memory transistors") each of which has a floating gate and variable threshold voltage. As disclosed in, for example, Japanese Patent Laid-Open Publication No. 2001-283595 (2001), a conventional flash memory includes a memory cell array which, in turn, includes a plurality of nonvolatile memory transistors arranged in rows and columns, a plurality of word lines for selecting the rows of the memory transistors, respectively and a plurality of bit lines corresponding to the columns of the memory transistors, respectively and is divided into a plurality of memory blocks each having a set of the memory transistors. The conventional flash memory further includes a potential generating portion for generating a potential applied to the word lines, the bit lines and substrates and sources of the memory transistors and a write/erase control portion for controlling the potential generating portion so as to erase data in all the memory transistors collectively or in units of the memory blocks.

A data erase method of the conventional flash memory of the above described configuration is disclosed in, for example, FIG. 42 of the prior art document referred to above. This known data erase method includes a first step of collectively applying a preliminary write pulse to the memory transistors, a second step of collectively applying a first erase pulse to the memory transistors and repeating, if it is judged that erase has not been completed, the first erase pulse application operation with change of intensity of the first erase pulse until it is judged that erase has been completed, a third step of collectively applying a write pulse to the memory transistors and repeating, if it is judged that recovery has not been completed, the write pulse application operation with change of intensity of the write pulse until it is judged that recovery has been completed, a fourth step of collectively applying a second erase pulse to the memory transistors and repeating, if it is judged that erase has not been completed, the second erase pulse application operation with change of intensity of the second erase pulse until it is judged that erase has been completed, and a fifth step of repeating, if the memory transistors are in an overerased state, a selective recovery operation on the memory transistors until the memory transistors are not in the overerased state.

In the above known data erase method, the first erase pulse application operation is performed prior to the first erase verify operation in the second step, the write pulse application operation is performed prior to the recovery verify operation in the third step and the second erase pulse application operation is performed prior to the second erase verify operation in the fourth step.

Therefore, in the above known data erase method, since the pulse application operation is inevitably performed prior to the verify operation in the second to fourth steps even if the pulse application operation is not necessary actually, it is difficult to stabilize and speed up the erase operation.

SUMMARY OF THE INVENTION

Accordingly, an essential object of the present invention is to provide, with a view to eliminating the above mentioned drawbacks of prior art, a method of erasing data of a nonvolatile semiconductor memory unit, in which by performing a verify operation prior to a pulse application operation, an unnecessary pulse application operation is eliminated such that it is possible to stabilize and speed up an erase operation.

In order to accomplish this object of the present invention, a data erase method of the present invention is applied to a nonvolatile semiconductor memory unit including a memory cell array which is provided with a plurality of nonvolatile memory transistors arranged in rows and columns, a plurality of word lines for selecting the rows of the memory transistors, respectively and a plurality of bit lines corresponding to the columns of the memory transistors, respectively and is divided into a plurality of memory blocks each having a set of the memory transistors, a potential generating portion for generating a potential applied to the word lines, the bit lines and substrates and sources of the memory transistors and a write/erase control portion for controlling the potential generating portion so as to erase the data in the memory transistors collectively or in units of the memory blocks.

The data erase method includes the first step of collectively applying a preliminary write pulse to the memory transistors, the second step of repeating, if the memory transistors are not in a first erased state, an operation of collective application of a first erase pulse to the memory transistors with change of intensity of the first erase pulse in second and subsequent application operations of the first erase pulse until the memory transistors assume the first erased state, the third step of repeating, if the memory transistors are not in a recovered state, an operation of collective application of a write pulse to the memory transistors with change of intensity of the write pulse in second and subsequent application operations of the write pulse until the memory transistors assume the recovered state, the fourth step of repeating, if the memory transistors are not in a second erased state, an operation of collective application of a second erase pulse to the memory transistors with change of intensity of the second erase pulse in second and subsequent application operations of the second erase pulse until the memory transistors assume the second erased state and the fifth step of repeating, if the memory transistors are in an overerased state, a selective recovery operation on the memory transistors until the memory transistors are not in the overerased state.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
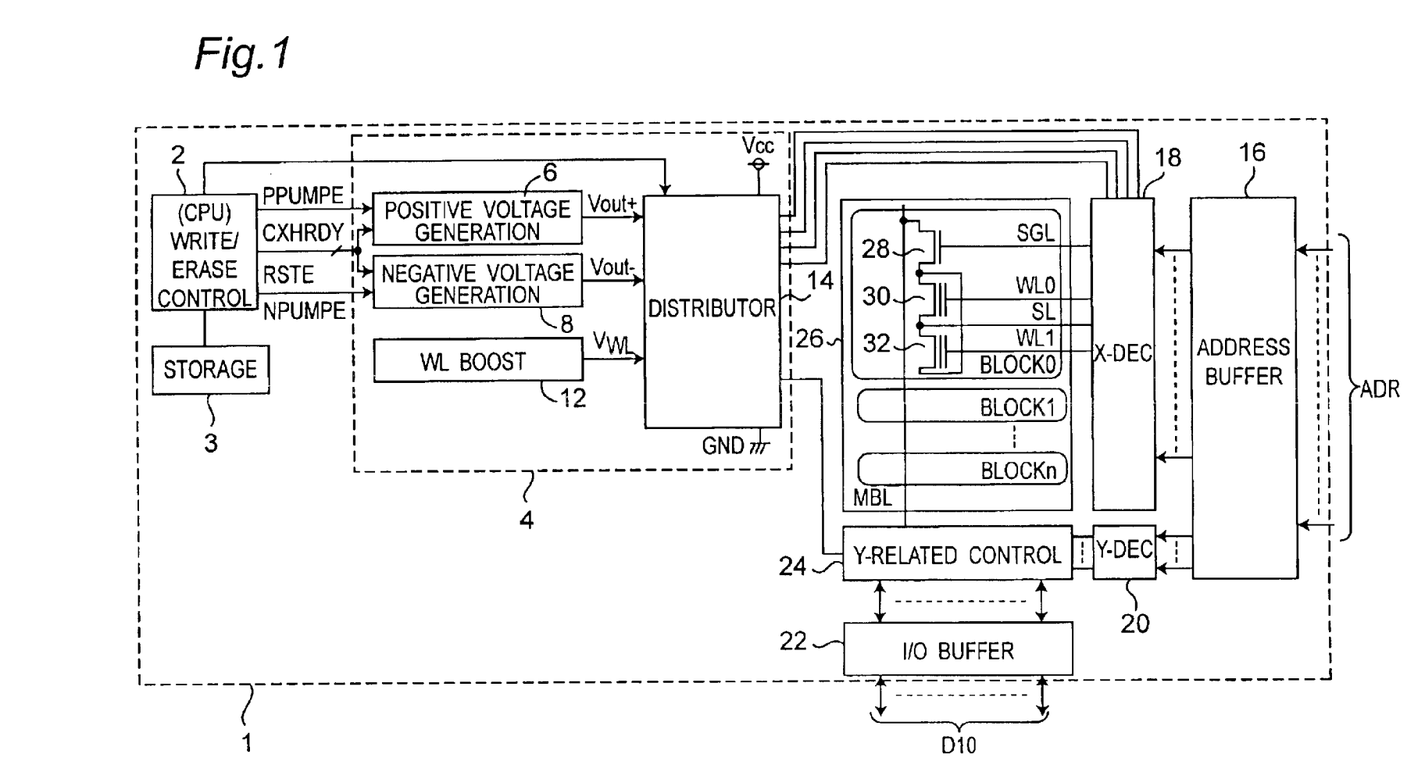
FIG. 1 is a block diagram showing a schematic configuration of a nonvolatile semiconductor memory unit to which a data erase method of the present invention may be applied.

FIG. 1 is a block diagram showing a schematic configuration of a nonvolatile semiconductor memory unit 1 to which a data erase method of the present invention may be applied. This nonvolatile semiconductor memory unit 1 is formed by a flash memory employing memory transistors as memory cells.

In the same manner as a conventional flash memory mentioned earlier, this flash memory includes (1) a memory cell array which, in turn, includes a plurality of nonvolatile memory transistors arranged in rows and columns, a plurality of word lines for selecting the rows of the memory transistors, respectively and a plurality of bit lines corresponding to the columns of the memory transistors, respectively and is divided into a plurality of memory blocks each having a set of the memory transistors, (2) a potential generating portion for generating a potential applied to the word lines, the bit lines and substrates and sources of the memory transistors and (3) a write/erase control portion for controlling the potential generating portion so as to erase data in all the memory transistors collectively or in units of the memory blocks.

As shown in FIG. 1, the nonvolatile semiconductor memory unit 1 includes a memory cell array 26 having a plurality of memory cells 30 and 32 arranged in two dimensions, a storage portion 3 for storing a sequence of a program code for executing write and erase on the memory cells 30 and 32 and a write/erase control portion 2 for reading out the sequence from the storage portion 3 so as to perform write and erase on the memory cells 30 and 32 on the basis of the sequence. Here, the storage portion 3 may be formed by either a ROM or a RAM.

The nonvolatile semiconductor memory unit 1 further includes a voltage generating portion 4 for generating output potentials Vout+, Vout− and $V_{WL}$ in response to a standby signal CXHRDY, a charge pump activating signal PPUMPE and a reset signal RSET received from the write/erase control portion 2, respectively, an address buffer 16 for receiving an address signal ADR from outside and an X-decoder 18 for determining respective potentials of a select gate line SGL, word lines WL0 and WL1, a source line SL and a well in response to an internal address signal received from the address buffer 16 and potentials supplied from the voltage generating portion 4.

The nonvolatile semiconductor memory unit 1 further includes an input/output buffer 22 for sending and receiving a data input/output signal DIO, a Y-decoder 20 for decoding the address signal received from the address buffer 16 and a Y-related control circuit 24 for applying a high voltage to a main bit line MBL in accordance with the data input/output signal in response to an output of the Y-decoder 20.

The voltage generating portion 4 includes a positive voltage generating circuit 6 for generating the output potential Vout+, a negative voltage generating circuit 8 for generating the output potential Vout−, a WL boost circuit 12 for generating the word line potential $V_{WL}$ and a distributor 14. The distributor 14 is controlled by the write/erase control portion 2 and receives the output potentials Vout+ and Vout− and the word line potential $V_{WL}$ so as to distribute them to the internal circuits. Meanwhile, the WL boost circuit 12 is a circuit for generating a boosted potential applied, for achieving fast access, to the word line WL and a select gate SG which are selected during read.

Although not specifically shown, the X-decoder 18 includes a WL decoder for selecting a word line, an SG decoder for selecting a select gate, a WELL decoder for selecting a well region corresponding to the selected memory block and an SL decoder for selecting a source line.

In addition, the Y-related control circuit 24 includes YG and sense amplifiers as well as latch circuits (not shown) for performing column selection during read and performing read by the sense amplifiers and a page buffer (not shown) for determining based on latched data whether or not a high potential should be applied to the main bit line MBL during write.

Meanwhile, the memory cell array 26 includes memory blocks BLOCK0 to BLOKn which are, respectively, formed in wells separated from each other. For example, the memory block BLOCK0 includes the memory cells 30 and 32 and a select gate 28. In the memory block BLOCK0, memory cells corresponding to the select gate line SGL, the word lines WL0 and WL1 and the source line SL, which are selected by the X-decoder 18, are selected and a signal corresponding to data is supplied from the main bit line MBL and is held. As a typical example, FIG. 1 shows that the select gate 28 and the memory cells 30 and 32 correspond to the select gate line SGL, the word lines WL0 and WL1 and the source line SL, which are selected.

Figure 2:
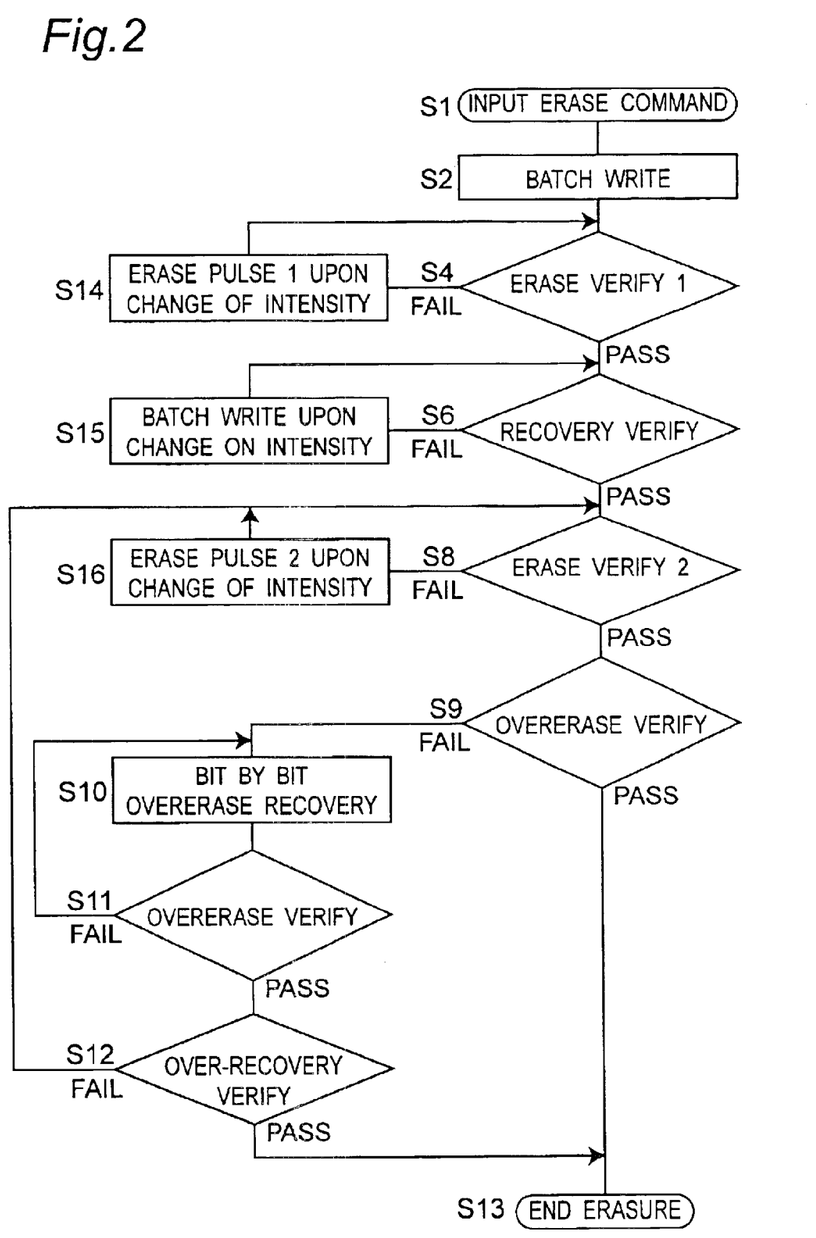
FIG. 2 is a flowchart showing a method of erasing data of the nonvolatile semiconductor memory unit, according to a first embodiment of the present invention.

FIG. 2 is a flowchart showing a method of erasing data of the nonvolatile semiconductor memory unit 1, according to a first embodiment of the present invention. In FIG. 2, initially, an erase command is inputted at step S1. Then, at step S2, a preliminary write pulse is collectively applied to the memory transistors. If it is found at first erase verify step S4 that the memory transistors are not in a first erased state, step S14 in which a first erase pulse is collectively applied to the memory transistors with change of intensity of the first erase pulse in second and subsequent application operations of the first erase pulse is executed repeatedly until it is judged at step S4 that the memory transistors are in the first erased state.

Then, if it is found at recovery verify step S6 that the memory transistors are not in a recovered state, step S15 in which a write pulse is collectively applied to the memory transistors with change of intensity of the write pulse in second and subsequent application operations of the write pulse is repeated until it is judged at step S6 that the memory transistors are in the recovered state. Thereafter, if it is found at second erase verify step S8 that the memory transistors are not in a second erased state, step S16 in which a second erase pulse is collectively applied to the memory transistors with change of intensity of the second erase pulse in second and subsequent application operations of the second erase pulse is executed repeatedly until it is judged at step S8 that the memory transistors are in the second erased state.

Furthermore, if it is found at overerase verify step S9 that the memory transistors are not in an overerased state, data erase terminates at step S13. On the other hand, if it is judged at step S9 that the memory transistors are in the overerased state, step S10 for selectively recovering the memory transistors is executed repeatedly until it is found at step S11 that the memory transistors are not in the overerased state. If it is judged at step S11 that the memory transistors are not in the overerased state, it is judged at step S12 whether or not the memory transistors are in an over-recovered state. If it is found at step S12 that the memory transistors are in the over-recovered state, the program flow returns to step S8. On the contrary, if it is judged at step S12 that the memory transistors are not in the over-recovered state, the program flow terminates at step S13.

In this embodiment, since the verify steps S4, S6 and S8 are, respectively, executed prior to the pulse application steps S14, S15 and S16, unnecessary pulse application operations are eliminated, so that it is possible to stabilize and speed up an erase operation.

(Second Embodiment)

Figure 3:
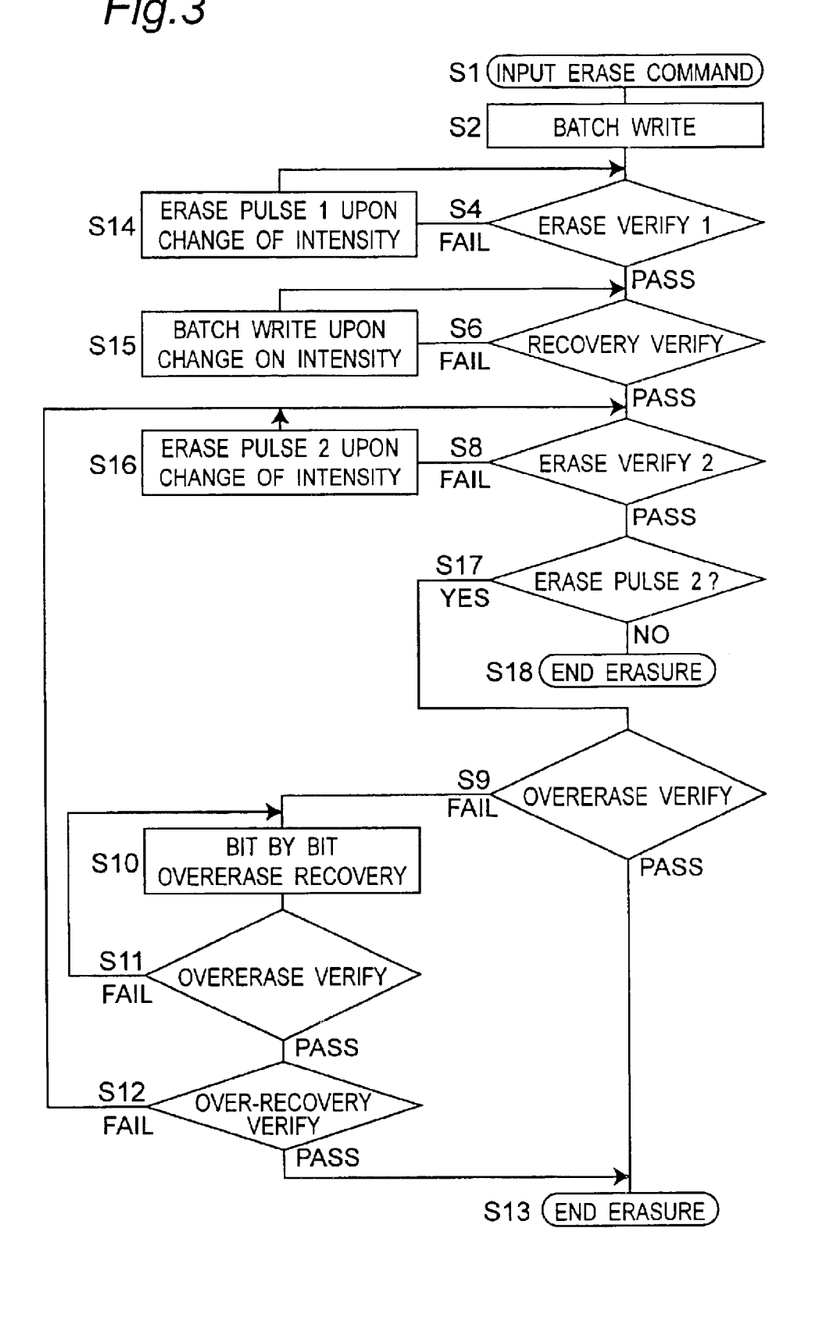
FIG. 3 is a flowchart showing a method of erasing data of the nonvolatile semiconductor memory unit, according to a second embodiment of the present invention.

FIG. 3 is a flowchart showing a method of erasing data of the nonvolatile semiconductor memory unit 1, according to a second embodiment of the present invention. In this embodiment, since the overerase verify step S9 is executed only after application of the second erase pulse, an erase operation is speeded up more than the first embodiment. To this end, step S17 for judging whether or not the second erase pulse has been collectively applied to the memory transistors is added after the second erase verify step S8 in FIG. 3. In the case of "NO" at step S17, data erase terminates at step S18. On the contrary, in the case of "YES" at step S17, the program flow proceeds to overerase verify step S9.

In this erase operation, by optimizing conditions of the first erase pulse application step S14, the write pulse application step S15, the second erase pulse application step S16 and the recovery verify step S6, the sequence of the overerase verify operation and the overerase recovery operation is executed so as to deal with leap of bits to an upper hem of a distribution of a threshold voltage Vth, which might occur during application of the second erase pulse. Hence, in case the second erase pulse is not collectively applied to the memory transistors at step S16, "NO" is obtained at step S17 and thus, data erase terminates at step S18.

In this embodiment, since the overerase verify operation and the overerase recovery operation are performed only after application of the second erase pulse, an erase operation can be speeded up further.

(Third Embodiment)

Figure 4A:
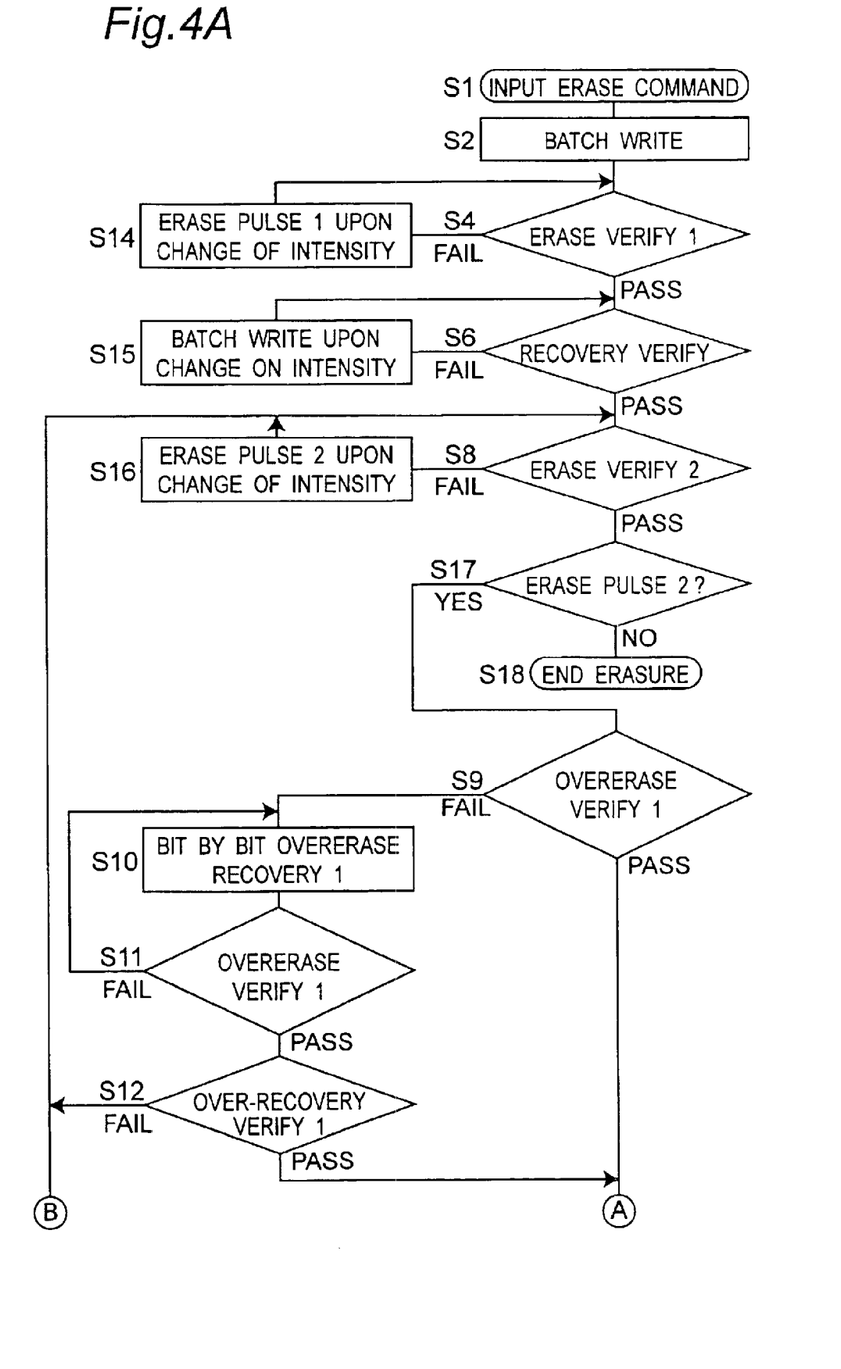
FIGS. 4A and 4B are first and second half portions of a flowchart showing a method of erasing data of the nonvolatile semiconductor memory unit, according to a third embodiment of the present invention, respectively.
Figure 4B:
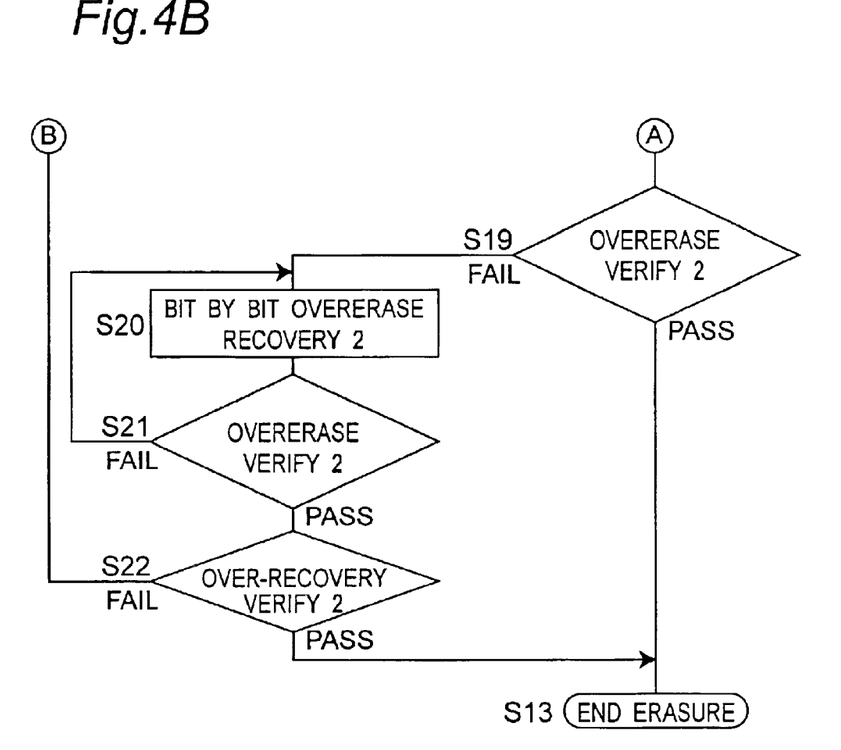

FIGS. 4A and 4B are a flowchart showing a method of erasing data of the nonvolatile semiconductor memory unit 1, according to a third embodiment of the present invention. In this embodiment, the second embodiment is modified such that not only 0 V is applied to nonselected word lines at the second erase verify step S8 but steps S9 to S12 for overerase verify and overerase recovery are divided into two stages having a first stage from step S9 to step S12 and a second stage from step S19 to S22.

In this embodiment, since 0 V is applied to the nonselected word lines at the second erase recovery step S8 and steps S9 to S12 for overerase verify and overerase recovery in the second embodiment are divided into the two stages having the first stage from step S9 to step S12 and the second stage from step S19 to step S22, it is possible to prevent occurrence of read error after completion of erase.

(Fourth Embodiment)

Figure 5A:
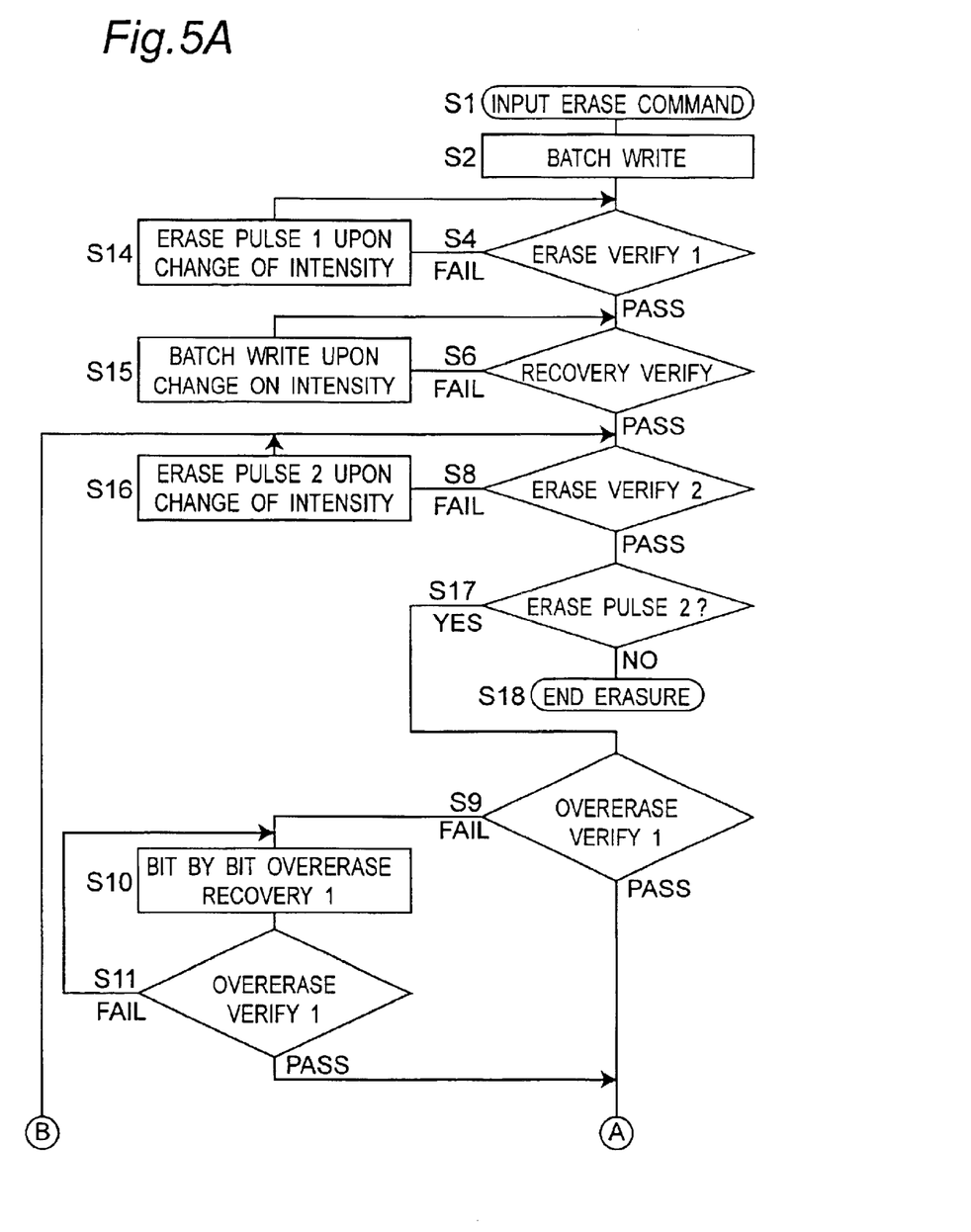
FIGS. 5A and 5B are first and second half portions of a flowchart showing a method of erasing data of the nonvolatile semiconductor memory unit, according to a fourth embodiment of the present invention, respectively.
Figure 5B:
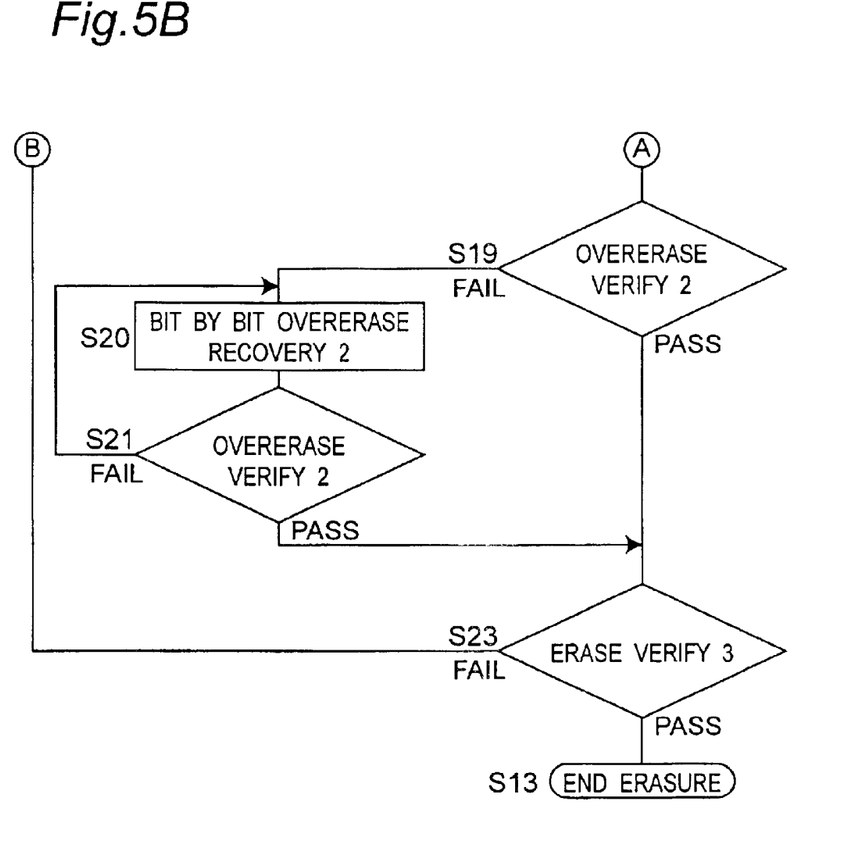

FIGS. 5A and 5B are a flowchart showing a method of erasing data of the nonvolatile semiconductor memory unit 1, according to a fourth embodiment of the present invention. In this embodiment, the third embodiment is modified such that third erase verify step S23 is executed prior to the erase end step S13 in place of the first over-recovery verify step S12 in FIG. 4A and the second over-recovery verify step S22 in FIG. 4B.

In this embodiment, since the two over-recovery verify steps S12 and S22 in the third embodiment are replaced by the single erase verify step S23, an erase operation can be further stabilized and speeded up.

As is clear from the foregoing description, since the data erase method of the present invention includes the first step of collectively applying a preliminary write pulse to the memory transistors, the second step of repeating, if the memory transistors are not in a first erased state, an operation of collective application of a first erase pulse to the memory transistors with change of intensity of the first erase pulse in second and subsequent application operations of the first erase pulse until the memory transistors assume the first erased state, the third step of repeating, if the memory transistors are not in a recovered state, an operation of collective application of a write pulse to the memory transistors with change of intensity of the write pulse in second and subsequent application operations of the write pulse until the memory transistors assume the recovered state, the fourth step of repeating, if the memory transistors are not in a second erased state, an operation of collective application of a second erase pulse to the memory transistors with change of intensity of the second erase pulse in second and subsequent application operations of the second erase pulse until the memory transistors assume the second erased state and the fifth step of repeating, if the memory transistors are in an overerased state, a selective recovery operation on the memory transistors until the memory transistors are not in the overerased state, unnecessary pulse application operations are eliminated by performing the verify operation prior to the pulse application operation, so that it is possible to stabilize and speed up an erase operation.

What is claimed is:

1. A method of erasing data of a nonvolatile semiconductor memory unit including a memory cell array which is provided with a plurality of nonvolatile memory transistors arranged in rows and columns, a plurality of word lines for selecting the rows of the memory transistors, respectively and a plurality of bit lines corresponding to the columns of the memory transistors, respectively and is divided into a plurality of memory blocks each having a set of the memory transistors, a potential generating portion for generating a potential applied to the word lines, the bit lines and substrates and sources of the memory transistors and a write/erase control portion for controlling the potential generating portion so as to erase the data in the memory transistors collectively or in units of the memory blocks, comprising the steps of:

collectively applying a preliminary write pulse to the memory transistors;

repeating, if the memory transistors are not in a first erased state, an operation of collective application of a first erase pulse to the memory transistors with change of intensity of the first erase pulse in second and subsequent application operations of the first erase pulse until the memory transistors assume the first erased state;

repeating, if the memory transistors are not in a recovered state, an operation of collective application of a write pulse to the memory transistors with change of intensity of the write pulse in second and subsequent application operations of the write pulse until the memory transistors assume the recovered state;

repeating, if the memory transistors are not in a second erased state, an operation of collective application of a second erase pulse to the memory transistors with change of intensity of the second erase pulse in second and subsequent application operations of the second erase pulse until the memory transistors assume the second erased state; and repeating, if the memory transistors are in an overerased state, a selective recovery operation on the memory transistors until the memory transistors are not in the overerased state.

2. The method according to claim 1, further comprising the step of confirming application of the second erase pulse, which is added between the step of repeating the operation of collective application of the second erase pulse and the step of repeating the selective recovery operation.

3. The method according to claim 2, wherein 0 V is applied to nonselected ones of the word lines in an erase verify operation in the step of repeating the operation of collective application of the second erase pulse and the step of repeating the selective recovery operation is executed in two stages having first-stage steps and second-stage steps.

4. The method according to claim 3, wherein a further erase verify step is added after the second-stage steps in place of a first over-recovery verify operation in the first-stage steps and a second over-recovery verify operation in the second-stage steps.

* * * * *